United States Patent [19] [11] 4,314,372
Bakgaard [45] Feb. 2, 1982

[54] METHODS AND MEANS FOR PRODUCING AND REPRODUCING TRANSMITTED OR RECORDED SOUND OR VIDEO SIGNALS

[75] Inventor: Knud E. Bakgaard, Struer, Denmark

[73] Assignee: Bang & Olufsen A/S, Struer, Denmark

[21] Appl. No.: 970,138

[22] Filed: Dec. 18, 1978

Related U.S. Application Data

[63] Continuation of Ser. No. 729,712, Oct. 5, 1976, abandoned.

[30] Foreign Application Priority Data

Oct. 6, 1975 [GB] United Kingdom ............... 40769/75

[51] Int. Cl.³ .............................................. H04B 3/04
[52] U.S. Cl. ..................................... 455/68; 455/115; 455/217; 455/232
[58] Field of Search ................ 325/37, 55, 62, 64, 325/133, 187; 179/15 BM, 15 BP, 15 BT, 15 BL, 15 BF, 1 VL; 455/31, 68, 70, 67, 115, 117, 217, 230, 232, 245, 246, 250

[56] References Cited

U.S. PATENT DOCUMENTS 3,174,100  3/1965  Orr, Jr. ................................. 325/62
3,859,597  1/1975  Zwaal .................................. 325/62

Primary Examiner—Joseph A. Orsino, Jr.
Assistant Examiner—Tommy P. Chin
Attorney, Agent, or Firm—Craig and Antonelli

[57] ABSTRACT

A sound transmission and reproduction system including at the transmitter side means for producing a nonaudible control signal indicative of a predetermined character of the transmitted sound, preferably the intensity of the sound as actually transmitted, whereby the transmitted sound may be artificially attenuated and amplified, respectively, in respective passages of high and low intensity so as to be transmittable within a restricted dynamic range. At the receiver side the control signal is detected and used for controlling the amplifier as an automatic volume control so as to effect extra amplification of the attenuated passages and attenuation of the artificially amplified passages so as to enable the reproduction to take place with the full dynamic range of the original sound. The control signal may serve to control other parameters of the reproduction, such as to actuate switch means for shifting between two or more general amplification levels or tone control settings according to the type of the sound being transmitted.

8 Claims, 1 Drawing Figure

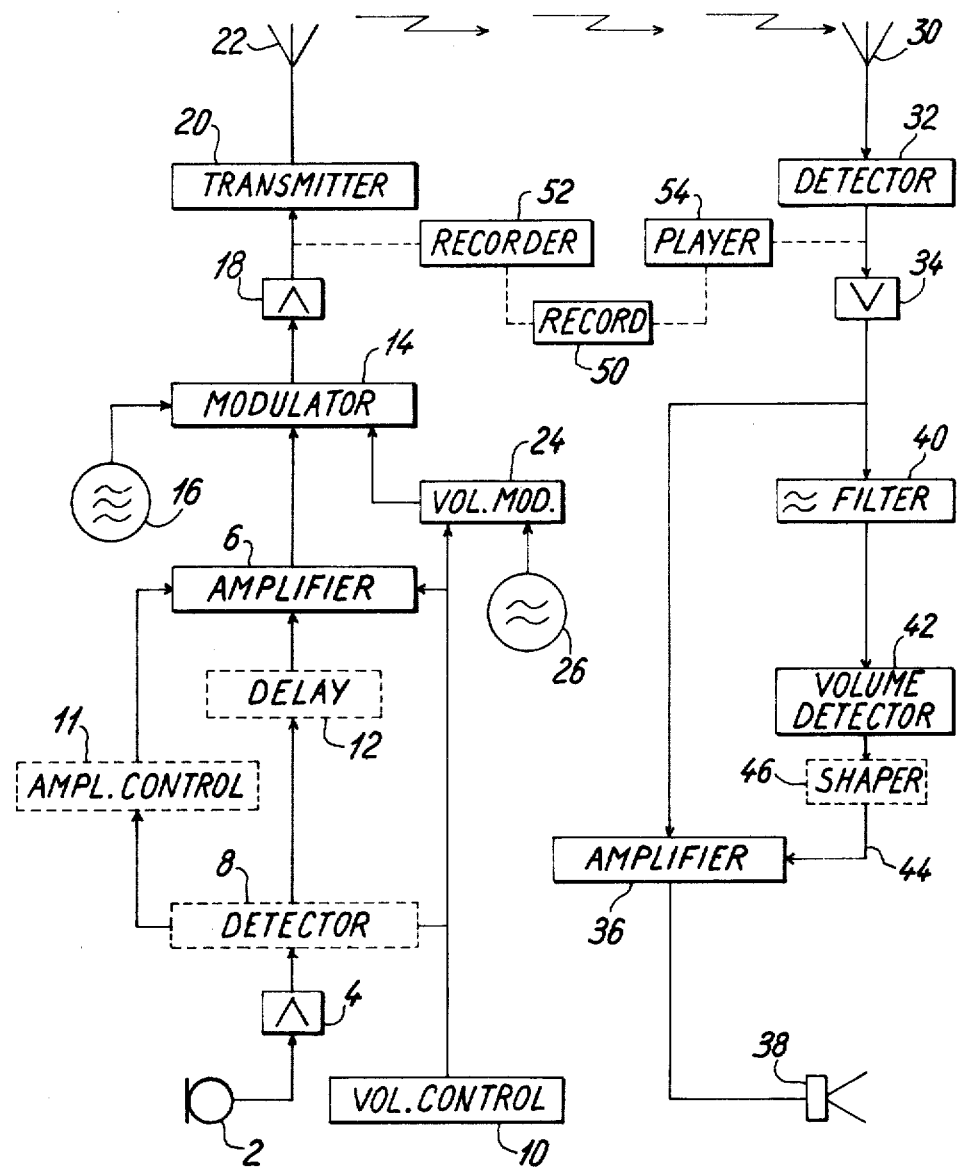

METHODS AND MEANS FOR PRODUCING AND REPRODUCING TRANSMITTED OR RECORDED SOUND OR VIDEO SIGNALS

This is a continuation of application Ser. No. 729,712, filed Oct. 5, 1976, now abandoned.

By reproduction of transmitted or recorded sound the intensity or volume of the sound is dependent essentially of three parameters, viz, partly the general volume level of the received signal, partly the intensity variations in the signal itself, causing the sound picture to be reproduced in a more or less true manner, and partly the adjustable setting of the degree of amplification in the receiver. By the latter adjustment by means of the usual volume control button it is possible to compensate for a particularly high or low intensity level of the received signal and to adapt the reproduction intensity level to individual requirements. Thereafter the intensity of the sound will be given by the variations in the signal itself, representing e.g. orchestral music having passages ranging from very low to very high sound intensity. The detailed intensity variations are given by the transmitted signal, i.e. defined or determined at the transmitter side of the system, and it is well known that the variations are not always optimal as seen from the listener's point of view, this for various reasons of both human and technical background. At the transmitter side different types of sound may be amplified more or less in a selective manner, whereby as an example it would be possible to meet many listeners' desire of getting talk passages between music passages amplified less than the music; however, other listeners or even the same listeners in other situations may have an opposite desire of getting the music amplified more than the talk, so generally the sound signal cannot be transmitted so as to fully satisfy everybody.

Intensity variations which are incorrect for technical reasons often occur in connection with orchestral music of particularly high or particularly low intensity. In radio transmission and some recording systems the technical equipment is capable of handling only a limited dynamic range, e.g. a range of some 60 decibels, while the intensity of orchestral music have range from some 10 dB to some 110 dB, i.e. a total dynamic range of some 100 dB. For this reason it is normal practice at the transmitter or recording side to effect an extra amplification of the signal when the sound is weakest and an attenuation of the signal when the sound is strongest, whereby the entire sound picture is transmittable within the said dynamic range of some 60 dB. Listeners may get used to accepting the resulting sound reproduction, but really a considerable distortion of the original sound picture may be involved, compared with concert hall music which may range from silence to near the pain threshold. Normally the amplification control is carried out manually by a person knowing the music being played and operating the control means at the required moments of time. It has been suggested to make use of transmitter amplifiers having a non-linear amplification characteristic, whereby the signal may be "compressed" in a gradual manner by low and high intensities, and the signal may then be reproduced in a true manner by means of a receiver amplifier having a corresponding non-linear characteristic, but such systems are not used, mainly because it is still preferred to use amplifiers of linear response.

What has been said about sound signals equally applies, to a certain extent, to video signals.

The present invention relates to a method of producing, of reproducing a transmitted or recorded sound or video signal to be reproduced with a varying character such as the intensity thereof, and it is the purpose of the invention to provide such a method whereby the control of the said character on the reproducing side of the system is effectable in an automatic manner.

According to the invention, in connection with the transmission or recording of the sound or video signal, this signal is superimposed by informations contained in a carrier wave or a separate channel, said informations referring to a predetermined character such as the type or intensity of the signal, while by the reproduction of the signal the said informations are successively detected and used for controlling the reproduction accordingly. Hereby the signal itself may be transmitted in a quite conventional manner, while by means of the parallelly transmitted informations an automatic control of the receiver is enabled in such a manner that the reproduction is controllable so as to be automatically optimized in accordance with the character which is wanted to control the reproduction. In the said example of talk passages bridging music passages the information signal may be indicative of whether the main signal is talk or music, whereby it is usable for causing automatic switching between correspondingly different amplification levels on the receiver side, whereby the listener may adjust these two or even more levels individually according to his own desires.

According to another and perhaps more important aspect of the invention the transmitter controlled information signal may be used for optimizing the momentary reproduction of the main signal, e.g. by causing the amplification thereof to correspond with the amplification necessary to reproduce the original sound in a true manner, even if in a weak or strong passage of the music has been artificially amplified or attenuated in order to make the entire music transmittable in a reduced dynamic range.

It would be possible hereby to further reduce the dynamic range of the transmission equipment, but it is preferred to maintain the conventional dynamic range in order to make the system compatible so as to enable existing receivers to receive and reproduce the sound in conventional, approximately true manner.

At the transmitter side it will be relatively easy to automatically detect the intensity of the signal and make this detection control both the degree of signal amplification and the corresponding modulation or coding of the information signal, whereby the volume of the reproduced sound is controllable in an entirely automatic and true manner throughout the entire original dynamic range of the music. In such a system it is preferred to delay, upon said detection, the transmission of the main signal in such a manner that the control or information signal is transmitted slightly ahead of the sound signal to thereby give time for the receiver amplifier to get adjusted as required exactly when the associated sound signal arrives.

In the lowermost intensity range the artificial extra amplification of the signal will be of specific importance for enabling transmission of a weak signal at an intensity above the general noise level, whereby a weak signal, as attenuated by the reproduction, may be reproduced with no or little transmission noise. As far as video signals are concerned it is probably this aspect of the invention which is the most important, since video transmission noise often occurs in signals of low modulation, e.g. in dark evening and night pictures. In practice it may be difficult to make the detection of the intensity and the receiver amplification control follow the extremely rapid variations of the signal, but it may be sufficient to detect the average intensity of the successive entire TV-pictures and control the reproduction intensity accordingly.

Correspondingly, also in sound transmission systems it may be advantageous to use the invention for detecting and controlling the average intensity level through consecutive predetermined periods, rather than the detailed transient signal.

The information signal may be used for controlling the reproduction in any desired manner, e.g. for controlling the frequency range of the reproduced signal. By way of example, when as already mentioned the information signal is indicative of the main signal being talk or music, respectively, the talk information may be used for controlling a cut-off filter in the receiver so that the frequency range of the reproduced signal is limited to an intermediate range for producing an easily understandable talk, without such limitation occurring in the music passages. This, of course, may be combined with a selection possibility at the receiver and with the use of automatic intensity control as described.

Another parameter indicating a character of the transmitted main signal is the time of the day, and at the transmitter side the information signal may be coded so as to generally control actuator means in the receivers for changing the degree of receiver amplification of the main signal according to the time being day, evening or night, where the amplification requirements are not normally the same. This type of control might be effected on the main signal already at the transmitter side, but it would not be possible, then, to let the receiver make use of the control in a selective manner.

The invention also comprises a transmission or recording system, a receiver or player system and a recorded signal carrier, all as defined in the appended claims and adapted especially for use in connection with the method according to the invention. It should be emphasized that each of these systems are easily adaptable for fully compatible use, i.e. so as to be usable with other respective systems of conventional type.

In the following the invention is described in more detail with reference to the accompanying drawing, which is a block diagram of a transmitter/receiver system according to the invention.

The left hand side of the drawing illustrates a sound transmitter system including a microphone 2 which may represent a multimicrophone arrangement for multichannel transmission. The microphone signal is amplified by an amplifier 4 and and a following amplifier 6, between which a detector 8 may be arranged as described in more detail below. The amplifier 6 may be controlled in conventional manner by means of a volume control unit 10 including a potentiometer which is manually operated so as to reduce the amplification just prior to occurrance of a microphone signal of very high intensity and to correspondingly increase the amplification in connection with microphone signals of low intensity. Alternatively it will be possible to use an automatic volume control unit 11 connected with the said detector 8, which is a signal intensity detector, and with the amplifier 6 so as to correspondingly control the amplification level in direct response to the detected intensity of the microphone signal. When this arrangement is used a time delay unit 12 should preferably be interposed between the detector 8 and the amplifier 6 in order to give time for the adjustment of the amplifier to be completed when the detected signal arrives at the amplifier.

The output signal from the amplifier 6 is fed to a modulator 14 in which the signal is used for modulating a radio carrier wave from a wave generator 16, whereafter the modulated carrier wave passes an amplifier 18 and a transmitter station 20 from which it is transmitted through an antenna 22 in usual manner.

According to the present invention the output control signal from the volume control unit 10 or the detector 8 is fed not only to the amplifier 6, but additionally to a special volume modulator 24 in which the control signal is used for modulating a non-audible carrier wave, e.g. a 19 kHz wave, supplied from a wave generator 26. The modulated output of modulator 24 is fed to an extra input terminal of modulator 14, whereby the transmitted output signal of this modulator will consist of the radio carrier wave modulated with both the low frequency microphone signal and the output signal of the control or detector unit 10 or 8, respectively, as carried by the "intermediate frequency" of the wave from the generator 26. Thus, the radio wave from the antenna 22 will carry the microphone signal as usual, as well as an additional information corresponding either to the setting of the volume control unit 10 or to the output of the volume detector 8.

In the right hand side of the drawing is shown a receiver system having an antenna 30 from which the received signal in usual manner is fed to a detector 32 and through amplifiers 34 and 36 to a loudspeaker system 38. According to the invention the output of the amplifier 34 is connected additionally to a filter unit 40 which allows the carrier wave frequency of generator 26 to pass to a volume signal detector unit 42 which produces an output corresponding to the modulation of said carrier wave, i.e. representing the setting of the volume control 10 or the output of the volume detector 8 at the transmitter side. The output of detector 42 is fed as an amplification control signal to the amplifier 36 through a wire 44, in which may be arranged a circuit 46 adapted so as to cause the detected control or information signal to effect changes of the amplification in amplifier 36 with a time constant or progress corresponding to the manner in which the detector 8 causes variations of the amplification of amplifier 6 in the transmitter system.

As will be readily understood the control or information signal detected by the circuit 42 will be indicative of the degree of artificial amplification or attenuation of the microphone signal as effected by the intensity controlled amplifier 6, and the control signal is use for controlling the receiver amplifier 36 in such a manner that said artificial amplification or attenuation is compensated by a corresponding artificial attenuation or extra amplification, respectively, in the receiver system, whereby the full dynamic range of the original microphone signal may be reproduced in spite of the fact that the sound has been transmitted within a restricted dynamic range.

The invention would make it possible to make the transmitter/receiver system work within a generally reduced dynamic range, whereby especially the transmitter equipment could be simplified compared with usual standards, but it is preferred to maintain said standards in order to make the system according to the invention fully compatible. Nevertheless, the said possibility of operating the transmitter in a relatively narrow dynamic range with the use of the compensating control signal for the operation of the receiver amplifier is a very important aspect of the invention.

The principle of this invention is not limited to radio broadcasting, as it is applicable also in connection with cable transmission and with recording/playing of signal carriers of any type capable of holding a non-audible or -visible information for controlling the amplification or any other reproduction parameter of the main signal. By way of example a record may be recorded with a superimposed carrier wave modulated by the volume control signal, and if the frequency of the carrier wave is the same as the one standardized for radio transmissions, e.g. the said 19 kHz, the record player will be usable in direct connection with the amplifier and sound reproduction system of a radio set as modified according to the invention, as well as with conventional amplifiers. When the recorded music is transmitted by radio it will then be possible to avoid the use of the detector 8 and the modulator 24, because the volume control signal is produced by the record itself.

It is shown in the drawing that for recording a sound or video signal on a record, designated 50, the output signal from the amplifier 18 can be fed to the respective recorder 52, of course without use of the high frequency generator 16. A record player is designated 54 and connected to the amplifier 34 of the reproducing set. It will be appreciated that even in connection with recorded sound the control principles according to the invention will be very advantageous, not least because passages of very low intensity may be recorded with increased amplification, i.e. be handled at a level well above the general noise level.

As far as usual magnetic recorder tape is concerned it may be difficult to employ an ultrasonic carrier wave for the control signal, but a special control channel or even a subsonic control signal may be used.

The control or information signal from the transmitter is produceable by amplitude-, frequency- or pulse modulation of a carrier wave of any convenient frequency. Above, 19 kHz has been mentioned as an example, because it is already in use in connection with stereo transmissions. When the receiver is adapted to receive and detect the control signal in a differentiated manner the signal is usable for effecting control of the desired functions at the receiver side, whether in a gradually varying or a stepwise manner. In the latter case, as far as volume control is concerned, the amplification should of course be controllable in relatively small steps, e.g. of 1 dB. Besides, the control of the volume or the frequency range have been mentioned as examples only, since the information or control signal may be used for controlling other or further functions according to predetermined criteria.

What is claimed is:

1. A sound transmission system having audio signal input means, amplifier means for amplifying an audio signal from said audio signal input means and output circuit means for transmitting the output signal of said amplifier means to a signal utilization means comprising:

signal intensity detecting means for detecting the intensity of said audio signal supplied to said audio signal input means and producing a corresponding control signal in accordance therewith;

automatic amplification control circuit means for controlling the degree of amplification of said amplifier means in accordance with variations of said corresponding signal so that the dynamic range of the amplifier means output signal is narrower than the dynamic range of said audio signal;

auxiliary means included in said output circuit means for receiving said corresponding control signal from said intensity detecting means and effecting selective transmission of said corresponding control signal along with said transmission of the output signal of said amplifier means; and delay means coupled to an input of said amplifier means for delaying the arrival of said audio signal at said amplifier means for enabling proper adjustment of said amplifier means in response to said corresponding control signal derived from said audio signal prior to arrival of said audio signal at said amplifier means and to allow the corresponding control signal to be transmitted ahead of the audio signal to which it pertains.

2. A sound transmission system as defined in claim 1, wherein said signal utilization means comprises a phonograph system.

3. A sound transmission system as defined in claim 1, wherein said signal utilization system is a frequency modulation receiver system.

4. A sound reproduction system comprising:

receiver means including means for selectively receiving a signal with audio information contained therein and deriving an audio signal therefrom and means for receiving a volume control signal corresponding to said audio signal and deriving a corresponding control signal therefrom, wherein the volume control signals are received immediately before the audio signals to which they correspond;

amplifier means for amplifying said audio signal and including a control means for automatically controlling the degree of amplification of said audio signal in accordance with the variations of said corresponding control signal derived in said volume control signal receiving means;

shaping means interposed in the connection between said control means of said amplifier means and said volume control signal receiving means for effecting the utilization of a sequence of said corresponding volume control signal pertaining to a sequence of a following audio signal to correctly control the amplification on the occurrence of said following audio signal sequence; and audio means for producing an audio output in response to the audio signals amplified by said amplifier means.

5. A sound reproduction system as defined in claim 4, wherein said shaping means comprises means for enabling said control signal to control the amplification of said amplifier means in accordance with a predetermined time constant.

6. A sound reproduction system as defined in claim 4, wherein said receiver means is a frequency modulation receiver.

7. A sound reproduction system as defined in claim 4, wherein said receiver means includes a record for use with a phonograph wherein said signal with audio information and said volume control signal are contained thereon.

8. A sound transmission and reproduction system having audio signal input means, amplifier means for amplifying an audio signal from said audio signal input means and output circuit means for transmitting the output signal of said amplifier means to a receiver means, said system comprising:

signal intensity detecting means for detecting the intensity of said audio signal supplied to said audio signal input means and producing a corresponding control signal in accordance therewith;

automatic amplification control circuit means for controlling the degree of amplification of said amplifier means in accordance with variations of said corresponding control signal so that the dynamic range of the amplifier means output signal is narrower than the dynamic range of said audio signal;

auxiliary means included in said output circuit means for receving said corresponding control signal from said intensity detecting means and effecting selective transmission of said corresponding control signal along with said transmission of the output signal of said amplifier means;

delay means coupled to an input of said amplifier means for delaying the arrival of said audio signal at said amplifier means for enabling proper adjustment of said amplifier means in response to said corresponding control signal derived from said signal prior to arrival of said audio signal at said amplifier means, and to allow the corresponding control signal to be transmitted ahead of the audio signal to which it pertains;

receiver means including means for selectively receiving said output signal with audio information contained therein and deriving an audio signal therefrom and means for receiving said corresponding control signal;

amplifier means for amplifying said audio signal and including a control means for automatically controlling the degree of amplification of said audio signal in accordance with the variations of said corresponding control signal derived in said control signal receiving means;

shaping means interposed in the connection between said control means of said amplifier means and said control signal receiving means for effecting the utilization of a sequence of said corresponding control signal pertaining to a sequence of a following audio signal to correctly control the amplification on the occurrence of said following audio signal sequence; and audio means for producing an audio output in response to the audio signals amplified by said amplifier means.

* * * * *